(12) United States Patent
Bedell et al.

(10) Patent No.: US 8,765,577 B2
(45) Date of Patent: Jul. 1, 2014

(54) DEFECT FREE STRAINED SILICON ON INSULATOR (SSOI) SUBSTRATES

(75) Inventors: Stephen W. Bedell, Wappingers Falls, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/614,308

(22) Filed: Sep. 13, 2012

(65) Prior Publication Data
US 2014/0070215 A1    Mar. 13, 2014

Related U.S. Application Data

(63) Continuation of application No. 13/612,675, filed on Sep. 12, 2012.

(51) Int. Cl.
*H01L 21/461*    (2006.01)

(52) U.S. Cl.
USPC .......................................... 438/455; 438/458

(58) Field of Classification Search
None
See application file for complete search history.

(56) References Cited

U.S. PATENT DOCUMENTS

| | | | |
|---|---|---|---|
| 6,603,156 B2 | 8/2003 | Rim | |
| 7,262,087 B2 | 8/2007 | Chidambarrao et al. | |
| 7,524,740 B1 | 4/2009 | Liu et al. | |
| 7,544,585 B2 | 6/2009 | Park et al. | |
| 7,897,480 B2 | 3/2011 | Chu et al. | |
| 7,939,427 B2 | 5/2011 | Neyret et al. | |
| 2002/0142562 A1* | 10/2002 | Chan et al. | 438/406 |
| 2006/0073708 A1* | 4/2006 | Maa et al. | 438/795 |
| 2007/0111468 A1 | 5/2007 | Xie et al. | |
| 2007/0117350 A1 | 5/2007 | Seacrist et al. | |
| 2007/0249140 A1* | 10/2007 | Dross et al. | 438/458 |
| 2008/0038932 A1* | 2/2008 | Wagner | 438/753 |
| 2010/0311250 A1* | 12/2010 | Bedell et al. | 438/759 |
| 2010/0323472 A1* | 12/2010 | Dross et al. | 438/96 |

(Continued)

OTHER PUBLICATIONS

Hutin, L., et al., "20nm Gate Length Trigate pFETS on Strained SGOI for High Performance CMOS", Symposium on VLSI Technology Digest of Technical Papers, Jun. 2010, pp. 37-38.

Irisawa, T., et al., "High-Performance Uniaxially Strained SiGe-on-Insulator pMOSFETs Fabricated by Lateral-Strain-Relaxation Technique", IEEE Transactions on Electron Devices, Nov. 2006, vol. 53, No. 11, pp. 2809-2815.

(Continued)

*Primary Examiner* — Charles Garber
*Assistant Examiner* — Stanetta Isaac
(74) *Attorney, Agent, or Firm* — Scully, Scott, Murphy & Presser, P.C.; Louis J. Percello, Esq.

(57) ABSTRACT

A method of forming a strained semiconductor material that in one embodiment includes forming a cleave layer in a host semiconductor substrate, and contacting a strain inducing material layer on a surface of a transfer portion of the host semiconductor substrate. A handle substrate is then contacted to an exposed surface of the stress inducing material layer. The transfer portion of the host semiconductor substrate may then be separated from the host semiconductor substrate along the cleave layer. A dielectric layer is formed directly on the transfer portion of the host semiconductor substrate. The handle substrate and the stress inducing material are then removed, wherein the transferred portion of the host semiconductor substrate provides a strained semiconductor layer that is in direct contact with a dielectric layer.

19 Claims, 3 Drawing Sheets

(56) References Cited

U.S. PATENT DOCUMENTS

2011/0175166 A1     7/2011   Bedell et al.
2012/0255600 A1*   10/2012   Bedell et al. .................. 136/255
2012/0318334 A1*   12/2012   Bedell et al. .................. 136/255
2013/0025654 A1*    1/2013   Bedell et al. .................. 136/255

OTHER PUBLICATIONS

U.S. Appl. No. 13/565,378 filed Aug. 2, 2012.
Office Action dated Dec. 19, 2013 received in the parent U.S. Appl. No. 13/612,675.

* cited by examiner

DEFECT FREE STRAINED SILICON ON INSULATOR (SSOI) SUBSTRATES

CROSS REFERENCE TO RELATED APPLICATION

This application is a divisional of U.S. patent application Ser. No. 13/612,675, filed Sep. 12, 2012 the entire content and disclosure of which is incorporated herein by reference.

BACKGROUND

The present disclosure relates to electrical device manufacturing, and more particularly to semiconductor devices having strain based performance enhancements.

In order to be able to make integrated circuits (ICs), such as memory, logic, and other devices, of higher integration density than currently feasible, one has to find ways to further downscale the dimensions of field effect transistors (FETs). Scaling in intended to achieve compactness and to improve the operating performance by shrinking the overall dimensions and operating voltages of the device. With scaling increasingly reaching its physical limits, other methods of increasing performance of semiconductor devices have been contemplated, such as strain based performance enhancements.

SUMMARY

In one embodiment, the present disclosure provides a method of forming a strained semiconductor material that may begin with forming a cleave layer in a host semiconductor substrate and contacting a strain inducing material layer to a transfer portion of the host semiconductor substrate. The strain inducing material layer induces a strain in the transfer portion of the host semiconductor substrate. A first handle substrate is contacted to an exposed surface of the strain inducing material layer. The transfer portion of the host semiconductor substrate is separated from the host semiconductor substrate along the cleave layer. A second handle substrate is bonded to the transfer portion of the host semiconductor layer. The bonding of the second handle substrate to the transfer portion retains the strain in the transfer portion that is induced by the strain inducing material layer. The first handle substrate and the strain inducing material layer are removed, wherein the transferred portion of the host semiconductor substrate provides a strained semiconductor layer that is bonded to the second handle substrate.

In another embodiment, a method of forming a strained semiconductor material is provided that may begin with a semiconductor on insulator (SOI) substrate. The semiconductor on insulator (SOI) substrate includes a semiconductor on insulator (SOI) layer that is present on a buried dielectric layer, wherein the buried dielectric layer is present on a first base semiconductor layer. In one embodiment, the semiconductor on insulator (SOI) layer of the SOI substrate is contacted by a strain inducing material layer, wherein the strain inducing material layer is present on a handle substrate. The strain inducing material layer induces a strain in the SOI layer of the SOI substrate. The SOI substrate is then cleaved within the first base semiconductor layer. A remaining portion of the first base semiconductor layer that is present in contact with the buried dielectric layer may be removed by an etch process to provide an exposed surface of the buried dielectric layer. A second base semiconductor layer is contacted to the exposed surface of the buried dielectric layer, resulting in the strain memorization in the semiconductor on insulator (SOI) layer. The strain inducing material layer and the handle substrate may then be removed.

In another aspect, a semiconductor substrate is provided that includes a compressively strained silicon (Si) layer that is in direct contact with a buried dielectric layer. In one embodiment, the semiconductor substrate includes a semiconductor on insulator (SOI) layer that is composed of silicon (Si) having an intrinsic compressive strain. The SOI layer of silicon (Si) may have an intrinsic compressive strain ranging from 20 MPa to 2000 MPa. The silicon (Si) layer having the intrinsic compressive strain may have a thickness ranging from 2 nm to 2000 nm. The SOI layer has a first surface for semiconductor devices, and a second surface that is in direct contact with a buried dielectric layer.

In another aspect, an electrical device is provided that includes at least one p-type semiconductor device on a device surface of a compressively strained silicon (Si) layer. A buried dielectric layer is present in direct contact with a backside surface of the compressively strained silicon (Si) layer that is opposite the device surface of the compressively strained silicon (Si) layer. A base semiconductor layer positioned on a backside surface of the buried dielectric layer.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
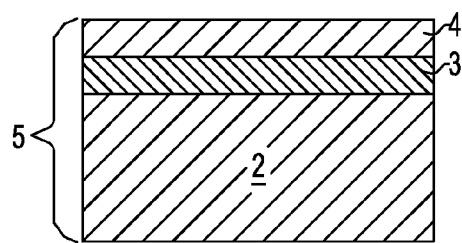
FIG. 1 is a side cross-sectional view depicting forming a cleave layer in a host semiconductor substrate, in accordance with one embodiment of the present disclosure.

Detailed embodiments of the present disclosure are described herein; however, it is to be understood that the disclosed embodiments are merely illustrative of the structures and method described herein that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the disclosed methods and structures. For purposes of the description hereinafter, the terms "upper", "lower", "vertical", "horizontal", "top", "bottom", and derivatives thereof shall relate to the invention, as it is oriented in the drawing figures.

Downscaling physical dimensions of metal-oxide-semiconductor field-effect transistors (MOSFETs) is one means to increase the number of transistors per chip while improving the performance of integrated circuits (ICs). In some instances, and as scaling increases, other technology boosters, such as embedded silicon germanium (SiGe) and silicon doped with carbon (Si:C) (to apply compressive and tensile strains, respectively, to the channel) as well as stress inducing liners may be necessary to maintain the performance enhancement trend. Furthermore, the incorporation of thin-body fully-depleted transistors, such as fin field effect transistors (FinFETs) and extremely thin semiconductor on insulator (ETSOI) devices, may be employed to control the short channel effects in transistors at the very small dimensions, such as devices having a contacted gate pitch ranging from 400 nm to 25 nm. However, it has been determined that incorporating strain based performance enhancements into thin body transistors, such as finFETs and ETSOI devices, using thermal mixing and strained silicon on insulator (SSOI) substrates wherein the strain layer is formed by epitaxial growth of Si on graded SiGe buffer, produces a high defect density on the order of $>1\times10^5$ defects/cm$^3$, in which the defects may include dislocation, misfit and loop defects. In some embodiments, the methods and structures disclosed herein may provide substantially defect free semiconductor on insulator (SOI) substrates with adjustable tensile or compressive strain levels. By "substantially defect free" it is meant that the defect density is less than $1\times10^5$ defects/cm$^3$. In some embodiments, to provide a substantially defect free semiconductor material a spalling method is employed, in which a stressor layer (hereafter referred to as a strain inducing material layer) is applied to a thin layer of semiconductor material, e.g., a semiconductor material layer having a thickness ranging from 2 nm to 2000 nm, prior to the release of the thin layer of semiconductor material from a host substrate via spalling. The strain inducing material layer has tensile stress. Furthermore, depending on the deposition conditions for forming the strain inducing material layer, the stress can be uniaxial or biaxial, while the amount of the stress can be also adjusted. Additionally, in some embodiments the release of the thin layer of semiconductor material and its subsequent bonding to a second handle substrate can be adjusted by the bonding parameters, such as temperature, to adjust the final amount of the strain that is being produced in the thin layer of semiconductor material. The details of some embodiments of this method, and the structures produced therefrom, are now discussed with reference to FIGS. 1-6.

FIG. 1 depicts one embodiment of forming a cleave layer 3 in a host semiconductor substrate 5. In some embodiments, the cleave layer 3 is a germanium (Ge) containing material. The germanium (Ge) containing material may be silicon germanium (SiGe). In some examples, the germanium (Ge) content of the germanium (Ge) containing material of the cleave layer 3 may be less than 25 wt. %. In other examples, the germanium (Ge) content of the germanium (Ge) containing material of the cleave layer 3 may range from 25 wt. % to 50 wt. %. In one embodiment, the cleave layer 3 may be comprised entirely of germanium (Ge). For example, the cleave layer 3 may be substantially entirely germanium (Ge). By substantially entirely germanium (Ge) it is meant that the germanium layer can include greater than 99 wt. % germanium (Ge) with incidental impurities.

In one embodiment, forming the cleave layer 3 in the host semiconductor substrate 5 includes providing a first base semiconductor layer 2, forming the cleave layer 3 of the germanium (Ge) containing material on the first base semiconductor layer 2, and forming a silicon (Si) layer 4 directly on the cleave layer 3 of the germanium (Ge) containing material. In one embodiment, the first base semiconductor layer 2 is silicon (Si). In some embodiments, first base semiconductor layer 2 is a bulk semiconductor material. In other embodiments, first base semiconductor layer 2 may comprise a layered semiconductor material such as, e.g., a semiconductor-on-insulator or heteroepitaxial layers grown on a single-crystal substrate.

The cleave layer 3 may be formed on the upper surface of the first base semiconductor layer 2. In one embodiment, the cleave layer 3 is germanium (Ge) containing material that is formed on the upper surface of the first base semiconductor layer 2 using an epitaxial deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. A number of different sources may be used for the deposition of epitaxial germanium (Ge) containing materials for the cleave layer 3, such as epitaxial silicon germanium (SiGe). In some embodiments, the gas source for the deposition of epitaxial silicon germanium may include a mixture of silicon (Si) containing gas sources and germanium (Ge) containing gas sources. For example, an epitaxial layer of silicon germanium (SiGe) may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The temperature for epitaxial silicon germanium (SiGe) deposition typically ranges from 100° C. to 900° C. Although higher temperature typically results in faster deposition, the faster deposition may result in crystal defects and film cracking. In one embodiment, the thickness of the cleave layer 3 composed of the epitaxially deposited germanium containing material, e.g., silicon germanium (SiGe), may range from 3 nm to 200 nm. In another embodiment, the thickness of the cleave layer 3 composed of the epitaxially deposited germanium containing material, e.g., silicon germanium (SiGe), range from 3 nm to 100 nm. The SiGe cleave layer is compressively strained and pseudomorphic to the silicon substrate.

In some embodiments, the germanium (Ge) containing material that provides the cleave layer 3 may be doped with boron (B). In the embodiments, in which the cleave layer 3 is silicon germanium (SiGe) doped with boron (B), the boron (B) in the cleave layer 3 improves the efficiency of hydrogen (H) trapping at the strained interface between the silicon (Si) layer 4 and the cleave layer 3 of silicon germanium (SiGe), which may also be referred to as a fracture plane. The boron (B) may be introduced to the germanium (Ge) containing material of the cleave layer 3 using an in-situ doping process. By in-situ implantation it is meant that the dopant, e.g., boron (B), is introduced to the cleave layer 3 during the epitaxial growth process that forms the cleave layer 3. In another embodiment, the boron (B) may be implanted into the germanium (Ge) containing material cleave layer 3 after its formation using ion implantation. The boron (B) concentration may range from $10^{17}$ dopants/cm$^3$ to $10^{21}$ dopants/cm$^3$.

Still referring to FIG. 1, a silicon (Si) layer 4 may be formed directly on the cleave layer 3. The term "direct contact" and "directly on" mean that a first element, such as a first structure, and a second element, such as a second structure, are connected without any intermediary conducting, insulating or semiconductor layers at the interface of the two elements. The terms "overlying", "atop", "positioned on" or "positioned atop" mean that a first element, such as a first structure, is present on a second element, such as a second structure, wherein intervening elements, such as an interface structure may be present between the first element and the second element. The silicon (Si) layer 4 provides the transfer portion of the host semiconductor layer 5.

The silicon (Si) layer 4 may be composed entirely of silicon (Si), e.g., 100 wt. %. The silicon (Si) layer 4 may also be composed substantially entirely of silicon (Si) with incidental impurities. By "substantially entirely" it is meant that the silicon (Si) layer 4 may include up to 5 wt. % of impurities with a remainder of silicon (Si). In one example, the level of impurities that may be present in the silicon (Si) layer 4 at this stage of the present disclosure may be no greater than 3 wt %. Examples of incidental impurities that may be present in the silicon (Si) layer 4 include carbon, hydrogen, nitrogen and combinations thereof. In another embodiment, the silicon (Si) layer 4 is composed of a silicon containing material that is greater than 90% silicon (Si). In another embodiment, the silicon (Si) layer 4 is composed of a silicon-containing material that is greater than 95% silicon (Si). In yet another embodiment, the silicon (Si) layer 4 is composed of greater than 99% silicon (Si), e.g., 100% silicon (Si). The aforementioned percentages allow for doping with n-type and p-type dopants.

The silicon (Si) layer 4 may have a thickness ranging from 2 nm to 2000 nm. In some embodiments, the silicon (Si) layer 4 may be thinned to a thickness of an extremely thin semiconductor on insulator (ETSOI) layer, e.g., 2 nm to 10 nm, by planarization, grinding, wet etch, dry etch, oxidation followed by oxide etch, or any combination thereof. One method of thinning the silicon (Si) layer 4 is to oxidize the silicon by a thermal dry or wet oxidation process, and then wet etch the oxide layer using a hydrofluoric acid mixture. This process can be repeated to achieve the desired thickness. In one embodiment, the silicon (Si) layer 4 has a thickness ranging from 2.0 nm to 10.0 nm. In another embodiment, the silicon (Si) layer 4 has a thickness ranging from 2.0 nm to 5.0 nm. In a further embodiment, the silicon (Si) layer 4 has a thickness ranging from 3.0 nm to 8.0 nm.

In some embodiments, the silicon (Si) layer 4 has a crystal orientation that is selected from the group consisting of (100), (110), and (111), with or without a miscut angle toward a crystallographic plane ranging from 0 degrees to 10 degrees towards a crystal plane selected from the group consisting of [110] and [111].

The cleave layer 3 provides a fracture plane (a region with weaker bonding than the source substrate), across which fracture may occur preferentially. This results in well-defined thickness of the transferred portion, i.e., silicon layer 4, of the host semiconductor substrate 5, as well as smoother fractured surfaces, improved reusability of the host semiconductor substrate 5 and a convenient method of separate pre-processed layers in a well-controlled manner. The interfaces between the epitaxially formed silicon (Si) layer 4, the epitaxially formed germanium (Ge) containing cleave layer 4, and the base semiconductor layer 2 are strained, which results from the lattice size differential between the adjacent material layers of differing compositions. In some embodiments, if the above described host semiconductor substrate 5 including the cleave layer 4 is exposed to hydrogen ($H_2$) plasma, the hydrogen (H) collects at the strained SiGe/Si interfaces and weakens the bonding at those interfaces. In some embodiments, the hydrogen (H) attacks the sub-surface strained bonds at interface between the germanium (Ge) containing material of the cleave layer 3 and the silicon (Si) layer 4 that provides the transferred portion of the host substrate 5, thereby weakening the interface between the silicon (Si) layer 4 and the cleave layer 3. As indicated above, the incorporation of boron (B) in a cleave layer 3 composed of silicon germanium (SiGe) improves the efficiency of hydrogen (H) trapping at the strained interface between the cleave layer 3 and the silicon layer 4.

In one embodiment, the hydrogen ($H_2$) plasma applied to the host semiconductor substrate 5 for weakening the interface between the cleave layer 3 and the silicon (Si) layer 4, i.e., the transfer portion of the host semiconductor substrate 5, includes hydrogen ($H_2$) gas. The hydrogen ($H_2$) plasma may also include nitrogen gas ($N_2$), ammonia gas ($NH_3$) and noble gases. In some embodiments, the hydrogen ($H_2$) plasma exposure to the host semiconductor substrate 5 including the cleave layer 3 is carried out at a temperature ranging from 20° C. to 600° C. for a time period ranging from 1 second to 3600 seconds. Higher exposure times greater than 3600 seconds are also contemplated herein. In another embodiment, the exposure step to the host semiconductor substrate 5 including the cleave layer 3 is carried out at a temperature of from 150° C. to 400° C. for a time period ranging from 5 second to 3600 seconds. In some embodiments, heating is carried out in the presence of the reducing plasma. Moreover, the hydrogen ($H_2$) plasma exposure to the host semiconductor substrate 5 including the cleave layer 3 may be conducted at a pressure of from 1 mTorr to 20 Torr, a power of from 50 watts to 10,000 watts, and a gas flow rate of from 1 sccm to 10,000 sccm.

In some embodiments, after the hydrogen ($H_2$) plasma exposure to the host semiconductor substrate 5, the hydrogen (H) content at the interface between the germanium (Ge) containing material, e.g., silicon germanium (SiGe), of the cleave layer 3 and the silicon (Si) layer 4, i.e., the transfer portion of the host semiconductor substrate 5, may range from $10^{10}$ atoms/cm$^3$ to $10^{21}$ atoms/cm$^3$. In another embodiment, the hydrogen (H) content at the interface between the cleave layer 3 and the silicon (Si) layer 4 may range from $10^{16}$ atoms/cm$^3$ to $10^{20}$ atoms/cm$^3$. It is noted that the above description of the hydrogen ($H_2$) plasma exposure to the host semiconductor substrate 5 is only one example of a method for introducing hydrogen (H) to the interface between the cleave layer 3 and the silicon (Si) layer 4, i.e., transfer portion of the host semiconductor substrate 5, and is not intended to limit the present disclosure solely thereto. For example, other methods that are suitable for use with the present disclosure to introduce hydrogen (H) to an interface between the cleave layer 3 and the silicon (Si) layer 4 include, but are not limited to, hot acid exposure (e.g., HF acid), ion implantation, hot wire hydrogenation, and modifications thereof.

In some embodiments, the host substrate 5 includes a silicon doped with carbon (Si:C) layer (not shown) that is present between the cleave layer 3 and the first base semiconductor layer 2. The carbon (C) content of the silicon doped with carbon (Si:C) layer may range from 0.3% to 10%, by atomic weight %. In another embodiment, the carbon (C) content of the silicon doped with carbon (Si:C) layer may range from 1% to 2%. The silicon doped with carbon (Si:C) layer may be formed using an epitaxial deposition process. Due to the lattice mismatch between silicon doped with carbon (Si:C) and silicon (Si), the presence of an underlying silicon doped with carbon (Si:C) layer may result in a compressive strain in the transferred portion, i.e., silicon (Si) layer 4. This can further enhance the level of the compressive strain in the final structure.

Figure 2:
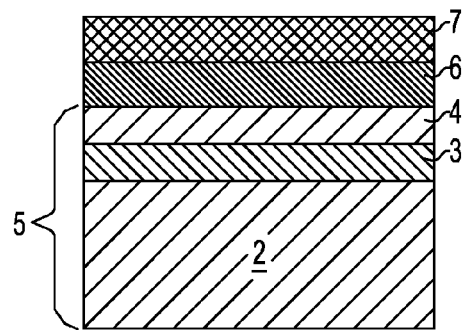
FIG. 2 is a side cross-sectional view depicting contacting a strain inducing material layer to a transfer portion of the host semiconductor substrate, wherein the strain inducing material layer induces a strain in the transfer portion of the host semiconductor substrate, in accordance with one embodiment of the present disclosure.

FIG. 2 depicts one embodiment of contacting a strain inducing material layer 7 to the silicon (Si) layer 4, i.e., transfer portion of the host semiconductor substrate 5, wherein the strain inducing material layer 7 induces a strain in the silicon (Si) layer 4. Before forming the strain inducing material layer 7, an interface dielectric layer 6 can be formed on the exposed surface of the silicon (Si) layer 4, i.e., transfer portion of the host semiconductor substrate 5. In the embodiments in which the interface dielectric layer 6 is present on the silicon (Si) layer 4, the strain inducing material layer 7 is in direct contact with the interface dielectric layer 6, and is in contact with the silicon (Si) layer 4 through the interface dielectric layer 6.

The interface dielectric layer 6 may be any dielectric material, such as an oxide, oxynitride, high-k dielectric, or nitride material. In some embodiments, the interface dielectric layer 6 may be composed of a material selected from the group consisting of silicon oxide, silicon oxnitride, silicon nitride, hafnium oxide, hafnium oxynitride, aluminum oxide and combinations thereof. In one example, the interface dielectric layer 6 is composed of silicon oxide ($SiO_2$). The thickness of the interface dielectric layer 6 may range from 2 nm to 2000 nm. In another embodiment, the thickness of the interface dielectric layer 6 may range from 5 nm to 100 nm.

The interface dielectric layer 6 may be formed on the exposed surface of the silicon (Si) layer 4, i.e., transfer portion of the host semiconductor substrate 5, using a deposition process, such as chemical vapor deposition (CVD), atomic layer deposition (ALD), or thermal oxidation methods. Variations of CVD processes that are suitable for depositing the interface dielectric layer 6 include, but not limited to, atmospheric pressure CVD (APCVD), low pressure CVD (LPCVD), plasma enhanced CVD (PECVD), metal-organic CVD (MOCVD) and combinations thereof. The interface dielectric layer 6 may also be deposited using evaporation, chemical solution deposition, spin on deposition, and physical vapor deposition (PVD) methods. The interface dielectric layer 6 is optional and may omitted. In some embodiments, the interface dielectric layer 6 increases the adhesion of the subsequently formed strain inducing material layer to the upper surface fo the silicon (Si) layer 4, i.e., the transfer portion of the host semiconductor substrate 5 or serve as a diffusion barrier to prevent diffusion of strain inducing material into the transferred portion 4.

In some other embodiments, a metal-containing adhesion layer (not shown) can be deposited when the subsequently formed strain inducing material layer 7 has poor adhesion to the silicon (Si) layer 4, i.e., the transfer portion of the host semiconductor substrate 5. The metal-containing adhesion layer that can be employed in the present disclosure includes any metal adhesion material such as, but not limited to, Ti/W, Ti and Cr or any combination thereof. The metal-containing adhesion layer may comprise a single layer or it may include a multilayered structure comprising at least two layers of different metal adhesion materials. The metal-containing adhesion layer can be formed at room temperature (15° C.-25° C.) or above. In one embodiment, the metal-containing adhesion layer is formed at a temperature, which is from 20° C. to 180° C. In another embodiment, the metal-containing adhesion layer is formed at a temperature, which is from 20° C. to 60° C. The metal-containing adhesion layer can be formed utilizing deposition techniques, such as sputtering, chemical vapor deposition (CVD), plasma enhanced chemical vapor deposition (PECVD), chemical solution deposition, physical vapor deposition (PVD) and plating. The metal-containing adhesion layer typically has a thickness of from 5 nm to 200 nm, with a thickness of from 10 nm to 100 nm being more typical. Other thicknesses for the metal-containing adhesion layer that are below and/or above the aforementioned thickness ranges can also be employed in the present disclosure. Similar to the interface dielectric layer 6, the metal-containing adhesion layer is optional and may omitted.

FIG. 2 depicts one embodiment of forming the strain inducing material layer 7 in direct contact with the upper surface of the interface dielectric layer 6. In the embodiments, the strain inducing material layer 7 may be in direct contact with the metal-containing adhesion layer. In the embodiments, in which an interface dielectric layer 6 and/or metal adhesion layer is (are) present, the strain inducing material layer 7 is contacting the silicon (Si) layer, i.e., the transfer portion of the host semiconductor substrate 5, through the interface dielectric layer 6 and/or the metal-containing adhesion layer. In the embodiments in which the interface dielectric layer 6 and the metal-containing adhesion layer are both omitted, the strain inducing material layer 7 may be in direct contact with the silicon (Si) layer 4, i.e., the transfer portion of the host semiconductor substrate 5.

The strain inducing material layer 7 may be used to create a fracture along the weak plane layer 3 (also referred to as cleave layer 3) in the host semiconductor substrate 5. The intrinsic stress of the strain inducing material 7 also produces a strain in the silicon (Si) layer 4, i.e., transferred portion of the host semiconductor substrate 5.

In one embodiment, the strain inducing material layer 7 is composed of a metal. When a metal is employed as the strain inducing material layer 7, the metal can include, for example, nickel (Ni), titanium (Ti), chromium (Cr), iron (Fe), molybdenum (Mo) or tungsten (W). Alloys of these metals can also be employed. In one embodiment, the strain inducing material layer 7 includes at least one layer consisting of nickel (Ni). In another embodiment, the strain inducing material layer 7 includes a polymer. When a polymer provides the strain inducing material layer 7, the polymer is a large macromolecule composed of repeating structural units. These subunits are typically connected by covalent chemical bonds. Illustrative examples of polymers that can be used as the strain inducing material layer 7 include, but are not limited to, polyimides, polyesters, polyolefins, polyacrylates, polyurethane, polyvinyl acetate, and polyvinyl chloride. The compressive strain induced by the strain inducing material layer 7 into the silicon (Si) layer 4 may range from 20 MPa to 2000 MPa. In another example, the compressive strain induced by the strain inducing material layer 7 into the silicon (Si) layer 4 may range from 100 MPa to 1000 MPa. Other embodiments have been contemplated in which the strain inducing material layer 7 and the subsequent bonding process induces a tensile strain in the silicon (Si) layer 4, i.e., the transferred portion of the host semiconductor substrate 5.

The strain inducing material layer 7 that is contacting the silicon (Si) layer 4, i.e., transfer portion of the host semiconductor substrate 5, has a critical thickness and stress value that cause spalling mode fracture to occur at the cleave layer 3 of the host semiconductor substrate 5. By "spalling mode fracture" it is meant that a crack is formed at the cleave layer 3 of the host semiconductor substrate 5, and the combination of loading forces maintain a crack trajectory at a depth along the cleave layer 3 of the host semiconductor substrate 5. By "critical condition", it is meant that for a given stressor material and substrate material combination, a thickness value and a stressor value for the stressor layer is chosen that render spalling mode fracture possible. Typically, spalling occurs when the strain inducing material has a tensile stress.

Specifically, the thickness of the strain inducing material layer 7 is chosen to provide the desired fracture depth, i.e., depth of the cleave layer 3, within the host semiconductor substrate 5. For example, if the strain inducing material layer 7 is chosen to be nickel (Ni), then fracture will occur at a depth below the stressor layer 5 roughly 2 to 3 times the nickel (Ni) thickness. The stress value for the strain inducing material layer 7 is then chosen to satisfy the critical condition for spalling mode fracture. This can be estimated by inverting the empirical equation given by $t^* = \{(2.5 \times 10^6 (K_{IC}^{3/2}))\}/\sigma^2$, where $t^*$ is the critical stressor layer thickness (in microns), $K_{IC}$ is the fracture toughness (in units of MPa·m$^{1/2}$) of the cleave layer 3 within host semiconductor substrate 5 and $\sigma$ is the stress value of the stressor layer (in MPa). The above expression is a guide, in practice, spalling can occur at stress or thickness values up to 20% less than that predicted by the above expression. Further, details regarding the above can be found in U.S. patent application Ser. No. 13/565,378, which is incorporated herein by reference.

When the strain inducing material layer 7 is composed of a metal, the strain inducing material layer 7 may be deposited using a physical vapor deposition (PVD) method, such as sputtering or plating. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the strain inducing material layer 7 include DC diode type systems, radio frequency (RF) sputtering, magnetron sputtering, and ionized metal plasma (IMP) sputtering. In another embodiment, the strain inducing material layer 7 is formed using a deposition process, such as chemical vapor deposition (CVD). Variations of chemical vapor deposition (CVD) processes for depositing the strain inducing material layer 7 include, but are not limited to, atmospheric pressure CVD (APCVD), low pressure CVD (LPCVD) and plasma enhanced CVD (PECVD), metal organic CVD (MOCVD) and others.

In some embodiments, the strain inducing material layer 7 may induce a biaxial or uniaxial strain on the silicon (Si) layer 4, i.e., the transfer portion of the host semiconductor substrate 5. The term "biaxial" as used to describe a strain means that the strain is introduced in two directions (x-y) along the surface that the strain is being applied to, e.g., the silicon (Si) layer 4, in which the x and y directions are both parallel to the plane defined by the upper surface of the substrate. The term "biaxial strain" may also be referred to as a global strain. The term "uniaxial" as used to describe a strain means that the strain is introduced in only one direction along the surface that the strain is being applied to. Further, details regarding uniaxial strains can be found in U.S. patent application Ser. No. 13/565,378, which is incorporated herein by reference.

In some embodiments, the strain inducing material layer 7 has a tensile stress to induce compressive strain in the transferred portion of the substrate, i.e., the silicon (Si) layer 4. The bonding condition should be engineered to maintain/enhance the compressive strain in the transferred portion, i.e., the silicon (Si) layer 4. For example, in a bilayer metal-Si structure, the bonding can be performed at temperatures below about 200° C. In some embodiments, the lower the temperature, the larger the amount of retained compressive strain. In some embodiments, at higher temperatures, the strain in the transferred portion is compensated due to the coefficient of thermal expansion (CTE) differences between the metal layer and the transferred portion. Depending on the metal layer, the level of its intrinsic tensile stress and thickness and the thickness of the transferred portion, the strain in the transferred portion will be compressive at near room temperature, and will go to nearly zero at a higher temperature governed by the CTE difference and will become tensile by further increase in the temperature before locking the strain by bonding it to the second handle wafer. As a result, the bonding temperature should be kept considerably below the temperature at which the compressive strain is compromised due to CTE mismatch.

Figure 3:
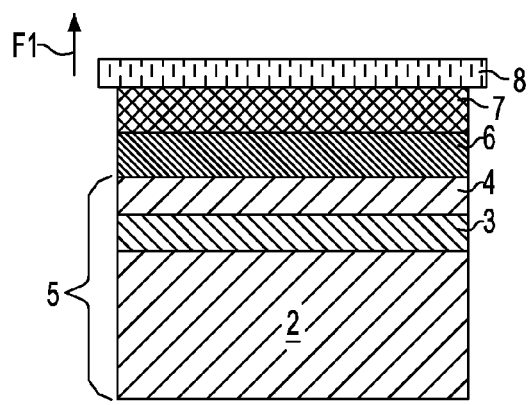
FIG. 3 is a side cross-sectional view depicting contacting a first handle substrate to an exposed surface of the strain inducing material layer, in accordance with one embodiment of the present disclosure.

FIG. 3 depicts one embodiment of contacting a first handle substrate 8 to an exposed surface of the strain inducing material layer 7. In some embodiments, the first handle substrate 8 is used to initiate and propagate the spalling process. This allows for better fracture control and more versatility in handling the separated silicon (Si) layer 4, i.e., transferred portion of the host semiconductor substrate. An example of an external loading technique that successfully leads to controlled spalling is to adhere a first handle substrate 8 including a foil to the strain inducing material layer 7, followed by pulling the foil of the first handle substrate 8 from in a direction away from the host semiconductor substrate 5 to facture the host semiconductor substrate 5 along the cleave layer 3 and remove the silicon (Si) layer 4 from the host semiconductor substrate 5. In some embodiments, the first handle substrate 8 may be flexible, and may have a minimum radius of curvature of less than 30 cm. In some embodiments, the first handle substrate 8 may be a pressure sensitive tape. By "pressure sensitive tape," it is meant an adhesive tape that will stick with application of pressure, without the need for solvent, heat, or water for activation. In some embodiments, the pressure sensitive tape that is utilized as the first handle substrate 8 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added. Some examples of spall inducing tapes that can be used in the present disclosure include, for example, Nitto Denko 3193MS thermal release tape, Kapton KPT-1, and Diversified Biotech's CLEAR-170 (acrylic adhesive, vinyl base). In one example, the material for first handle substrate 8 may be comprises a polyimide.

In some embodiments of the present disclosure, the exposed surface of the strain inducing material layer 7 can be cleaned prior to remove surface oxides and/or other contaminants therefrom before applying the first handle substrate 8 thereto. In one embodiment of the present disclosure, the exposed surface of the strain inducing material layer 7 is cleaned by applying to the strain including material layer 7 to a solvent such as, for example, acetone and isopropanol, which is capable of removing contaminates and/or surface oxides.

Figure 4:
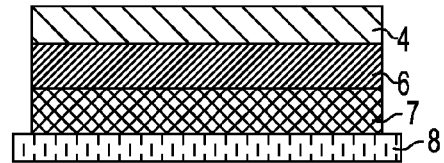
FIG. 4 is a side cross-sectional view depicting separating the transfer portion of the host semiconductor substrate from the host semiconductor substrate along the cleave layer, in accordance with one embodiment of the present disclosure.

FIG. 4 depicts one embodiment of separating the silicon (Si) layer 4, i.e., transfer portion of the host semiconductor substrate 5, from the host semiconductor substrate 5 along the cleave layer 3. In one embodiment, separating of the transfer portion of the host semiconductor substrate 5, i.e., the silicon (Si) layer 4, from the host semiconductor substrate 5 along the cleave layer 3 includes applying a force to the transfer portion of the host semiconductor substrate 5 through the first handle substrate 8 in a direction F1 away from the cleave layer 3. The separation of the silicon (Si) layer 4, i.e., transfer portion of the host semiconductor substrate 5, from the host semiconductor substrate 5 may be referred to as spalling. The spalling process can be completed at room temperature, e.g., 20° C. to 25° C.

Although the origin of the strain at the cleave layer 3 results from the strain inducing material layer 7, and the application of the force from the first handle substrate 8, and is not due to coefficient of thermal expansion (CTE) stress, heating the cleave layer 3 often has the effect of increasing the strain value. Localized heating is therefore contemplated to initiate fracture in the periphery of the area to be layer transferred. Localized heating can be performed using a laser, remote induction heating, or direct contact heating.

Following separating the silicon (Si) layer 4 from the host semiconductor substrate 5 along the cleave layer 3, the surface of the silicon (Si) layer 4 that is in direct contact with the cleave layer 3 is now exposed, and the remaining portion of the host semiconductor 5 which includes the first base semiconductor layer 2 and the cleave layer 3 may be removed. At this stage of the process flow, the strain inducing material layer 7 is still connected to the silicon (Si) layer 4. When the optional interface dielectric layer 6 and/or the optional metal-containing adhesion layer are present, the strain inducing material layer 4 is connected to the silicon (Si) layer 4 through the optional interface dielectric layer 6 and/or the optional metal-containing adhesion layer. At this stage of the process flow, in some embodiments the strain inducing material layer 7 is inducing a compressive strain on the silicon (Si) layer that may range from 10 MPa to 2000 MPa. In another embodiment, the strain inducing material layer 7 is inducing a compressive strain on the silicon (Si) layer that may range from 100 MPa to 1000 MPa.

Figure 5:
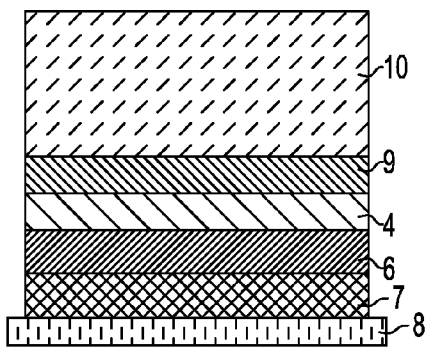
FIG. 5 is a side cross-sectional view depicting a second handle substrate being bonded to the transfer portion of the host semiconductor layer, wherein the bonding of the second handle substrate to the transfer portion of the host semiconductor layer memorializes the strain in the transfer portion that was induced by the strain inducing material layer, in accordance with one embodiment of the present disclosure.

FIG. 5 depicts one embodiment of bonding a second handle substrate 10 to the silicon containing layer 4 (also referred to as a transfer portion of the host semiconductor layer), wherein the bonding of the second handle substrate 10 to the silicon containing layer 4, i.e., transfer portion of the host substrate, retains the strain in the silicon containing layer 4 that was induced by the strain inducing material layer 7. Bonding of the second handle substrate 10 to the silicon (Si) layer 4 retains the strain in the silicon (Si) layer 4, i.e., transfer portion of the host semiconductor substrate, because the bonding to the second handle substrate 10 confines the lattice dimensions of the silicon (Si) layer 4 to the dimensions that are produced in the silicon (Si) layer 4 by the strain inducing material layer 7. Because the lattice dimensions of the silicon (Si) layer 4 are set in their strained state by bonding to the second handle substrate 10, the strain inducing material layer 8 may be removed without allowing the silicon (Si) layer 4 to relax. Therefore, following bonding of the second handle substrate 10 to the silicon (Si) layer 4, and the removal of the strain inducing material layer 7, the silicon (Si) layer 4 is under an intrinsic strain, such as an intrinsic compressive strain. An "intrinsic strain" as used herein refers to a strain, either compressive or tensile, that is developed within the strained layer, rather than an extrinsic strain that is applied to the layer by an external force.

FIG. 5 further depicts bonding the second handling substrate 10 to the silicon (Si) layer 4, in which a dielectric layer 9 is present between the second handling substrate 10 and the silicon (Si) layer 4. In one embodiment, a dielectric layer 9 is present in direct contact with the surface of the silicon (Si) layer 4 that is exposed by separating the host semiconductor substrate along the interface between the cleave layer and the silicon (Si) layer 4 and the second handle substrate 10. The dielectric layer 9 may be composed of any dielectric composition material. In some embodiments, the dielectric layer 9 may be composed of an oxide, a nitride or an oxynitride material. In some examples, the dielectric layer 9 may be composed of a material selected from the group consisting of silicon oxide, silicon oxnitride, silicon nitride, hafnium oxide, hafnium oxynitride, aluminum oxide, other high-k dielectrics and combinations thereof. In one example, the dielectric layer 9 is composed of silicon oxide ($SiO_2$). The thickness of the dielectric layer 9 may range from 5 nm to 500 nm. In another embodiment, the thickness of the dielectric layer 9 may range from 10 nm to 200 nm. It is noted that the above material compositions for the dielectric layer 9 and the thicknesses provided for the dielectric layer 9 are provided for illustrative purposes only, and are not intended to limit the present disclosure.

The second handling substrate 10 may be composed of a semiconductor material. In one embodiment, the semiconductor material that provides the second handling substrate 10 may include, but is not limited to, Si, Ge, SiGe, SiGeC, SiC, Ge alloys, GaSb, GaP, GaAs, GaN, $Al_2O_3$, InAs, InP, and all other III-V or II-VI compound semiconductors, individually or in combination. In some embodiments, the second handling substrate 10 is a bulk semiconductor material. In other embodiments, the second handling substrate 10 may comprise a layered semiconductor material such as, e.g., a semiconductor-on-insulator or heteroepitaxial layers grown on a single-crystal substrate. In another embodiment, the second handling substrate 10 is composed of glass. When the second handling substrate 10 comprises a glass, the glass can be an $SiO_2$ based glass. Examples of $SiO_2$ based glasses that can be employed as the second handling substrate 10 include undoped silicate glass, borosilicate glass, phosphosilicate glass, fluorosilicate glass, and borophosphosilicate glass. In some embodiments, the second handling substrate 10 is composed of a ceramic. When the second handling substrate 10 comprises a ceramic, the ceramic is any inorganic, non-metallic solid such as, e.g., an oxide including, but not limited to, alumina, beryllia, ceria and zirconia, a non-oxide including, but not limited to, a carbide, a boride, a nitride or a silicide, or composites that include combinations of oxides and non-oxides. In some embodiments, the second handling substrate 10 is composed of a metal. When the second handling substrate 10 is composed of a metal, the metal can be a rigid metallic substrate or a thin metallic foil. Such metallic handling substrates include, but are not limited to, stainless steels, copper, aluminium, molybdenum, Invar, Kovar, as well as other metals and their alloys.

The dielectric layer 9 may be deposited or thermally grown on either the second handle substrate 10, the transferred Si layer 4 or both. The transferred Si layer 4 is bonded to the second handle substrate 10 via bonding methods that allow Si-oxide or oxide-oxide bonding. The bonding methods include, but are not limited to, compression bonding, ionic bonding or plasma activation bonding or a combination of thereof. The process conditions primarily in terms of the bonding temperature are chose to mitigate the effect of coefficient of thermal expansion (CTE) mismatch between the transferred Si layer 4 and the strain inducing material 7 in order to maintain the compressive strain in the transferred Si layer 4. Bonding may be performed in several steps. For example, the compressive strain may first be memorialized by performing the bonding at temperatures that minimize CTE, which may then be followed by enhancing the bond strength by annealing the sample at higher temperatures before or after removing the strain inducing material 7 or a combination thereof.

In one embodiment the dielectric layer 9 may be formed on the transferred portion of the host semiconductor substrate 5, i.e., the silicon (Si) layer 4, using deposition and/or thermal growth processes, wherein after the dielectric layer 9 is formed on the silicon (Si) layer 4, the second handling substrate 10 may be bonded to the dielectric layer 9. In one example, the dielectric layer 9 may be deposited on the silicon (Si) layer using a chemical vapor deposition (CVD) process, such as atmospheric pressure CVD (APCVD), low pressure CVD (LPCVD) and plasma enhanced CVD (PECVD), metal organic CVD (MOCVD) and others. In another example, in which the dielectric layer 9 is silicon oxide ($SiO_2$), the dielectric layer 9 may be formed using a thermal oxidation method. Following formation of the dielectric layer 9, the second handling substrate 10 may be bonded directly to the dielectric layer 9. In some embodiments, the second handling substrate 10 is bonded to the dielectric layer 9 using thermal bonding, compression bonding, ionic bonding, adhesive bonding and plasma activation bonding or a combination of thereof. In some embodiments, the bonding method is applied at a temperature that is less than 300° C.

In another embodiment, the dielectric layer 9 is first formed on the second handling substrate 10, and then the combination of the dielectric layer 9 and the second handling substrate 10 is bonded to the transferred portion of the host semiconductor substrate, i.e., the silicon (Si) layer 4, wherein the dielectric layer 9 is bonded into direct contact with the exposed surface of the silicon (Si) layer 4. The dielectric layer 9 may be formed on the second handling substrate 10 using atomic layer deposition (ALD), chemical vapor deposition (CVD), thermal nitridation or thermal oxidation. The dielectric layer 9 may then be bonded onto the silicon (Si) layer 4 using thermal bonding, compression bonding, ionic bonding, adhesive bonding and plasma activation bonding or a combination of thereof, wherein the second handling substrate 10 is bonded to the silicon (Si) layer 4 through the dielectric layer 9. In yet another embodiment, the dielectric layer 9 may be formed on each of the second handling substrate 10 and the silicon (Si) layer 4, wherein after forming the dielectric layer 9 on each of the silicon (Si) layer and the second handling substrate 10, the silicon (Si) layer 4 and the second handling substrate 10 may be bonded to one another through their respective dielectric layers 9.

Figure 6:
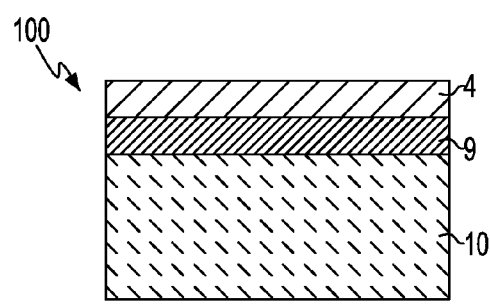
FIG. 6 is a side cross-sectional view depicting removing first handle substrate and the strain inducing material layer, wherein the transferred portion of the host semiconductor substrate provides a strained semiconductor layer that is in direct contact with the dielectric layer, in accordance with one embodiment of the present disclosure.

FIG. 6 depicts one embodiment of removing the first handle substrate 8 and the strain inducing material layer 7. The transferred portion of the host semiconductor substrate, i.e., the silicon (Si) layer 4, provides a strained semiconductor layer that is in direct contact with the dielectric layer 9. The first handle substrate 8 and the strain inducing material layer 7 may be removed using a selective etch process. As used herein, the term "selective" in reference to a material removal process denotes that the rate of material removal for a first material is greater than the rate of removal for at least another material of the structure to which the material removal process is being applied. For example, a first material may be removed with a selectivity of greater than 100:1 to a second material. In some embodiment, the first handle substrate 8, the strain inducing material layer 7, and the interface dielectric layer 6 may be removed by an etch that is selective to the silicon (Si) layer 4. The etch process may be a wet chemical etch or may be referred to as reactive ion etch (RIE).

Following removal of the first handle substrate 8, the strain inducing material layer 7 and the interface dielectric layer 6, the remaining structure depicted in FIG. 6 provides a semiconductor substrate 100 that may include a compressively strained silicon (Si) layer having an intrinsic compressive strain ranging from 10 MPa to 2000 MPa. The compressively strained silicon (Si) layer is provided by the silicon (Si) layer 4 that is transferred from the host semiconductor substrate. In one example, the intrinsic compressive strain of the compressively strained silicon (Si) layer ranges from 100 MPa to 1000 MPa. In one embodiment, the compressively strained silicon (Si) layer may have a defect density that is less than $1 \times 10^5$ defects/$cm^3$. In another embodiment, the compressively strained silicon (Si) layer may have a defect density that is less than $1 \times 10^4$ defects/$cm^3$. In yet another embodiment, the compressively strained silicon (Si) layer may have a defect density that is less than $1 \times 10^3$ defects/$cm^3$.

The semiconductor substrate 100 further includes a buried dielectric layer that is present underlying the compressively strained silicon (Si) layer, wherein a first surface of the buried dielectric layer is in direct contact with a surface of the compressively strained silicon (Si) layer. The buried dielectric layer may be provided by the dielectric layer 9 that fixes, i.e., memorizes, the strain upon bonding from the strain inducing material layer into the silicon (Si) layer 4 that provides the compressively strained silicon (Si) layer. A base semiconductor layer is in contact with a second surface of the buried dielectric layer that is opposite the first surface of the buried dielectric layer that is in direct contact with the compressively strained (Si) layer. The base semiconductor layer may be provided by the second handling substrate 10.

Figure 7:
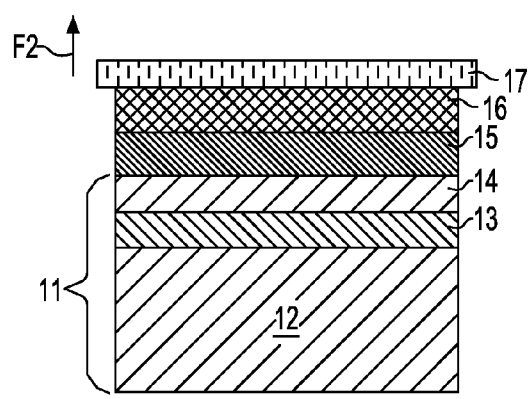
FIG. 7 is a side cross-sectional view depicting the initial process steps on another method for forming a strained semiconductor material that includes contacting a semiconductor on insulator (SOI) layer of a semiconductor on insulator (SOF) substrate with a strain inducing material layer, and separating the SOI substrate within a first base semiconductor layer of the SOI substrate, in accordance with one embodiment of the present disclosure.

In another embodiment of the present disclosure, a method is provided for forming a strained semiconductor material that includes contacting a semiconductor on insulator (SOI) layer of a SOI substrate with a strain inducing material layer, and separating the SOI substrate within the first base semiconductor layer, as depicted in FIG. 7. FIG. 7 depicts one embodiment of a semiconductor on insulator (SOI) substrate 11 that includes at least a semiconductor on insulator (SOI) layer 14 overlying a buried dielectric layer 13, wherein the buried dielectric layer 13 is present over a base semiconductor layer 12. In the embodiments that form a compressively strained silicon layer for the channel region of p-type semiconductor devices, the SOI layer 14 may be a silicon (Si) layer. The SOI layer 14 that is depicted in FIG. 7 is similar in composition and dimensions as the silicon (Si) layer 4 that is depicted in FIG. 1. Therefore, the above description regarding the composition and dimensions of the silicon (Si) layer 4 that is depicted in FIG. 1 is suitable for the SOI layer 14 that is depicted in FIG. 7. The SOI layer 14 may be thinned to a desired thickness by planarization, grinding, wet etch, dry etch, oxidation followed by oxide etch, or any combination thereof. The base semiconductor layer 12 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer identified by reference number 12 may also be referred to as a first base semiconductor layer.

The buried dielectric layer 13 may be any dielectric material, such as an oxide, nitride, high-k dielectrics or oxynitride. In one example, the buried dielectric layer 13 may be composed of silicon oxide ($SiO_2$). Further details regarding the composition and the dimensions of the buried dielectric layer 13 are provided by the description of the dielectric layer 9 that is depicted in FIG. 5. The buried dielectric layer 13 may be formed by implanting a high-energy dopant into the SOI substrate 11 and then annealing the structure to form a buried insulating layer 13. In another embodiment, the dielectric layer 13 may be deposited or grown prior to the formation of the SOI layer 14. In yet another embodiment, the SOI substrate 11 may be formed using wafer-bonding techniques, where a bonded wafer pair is formed utilizing glue, an adhesive polymer, or direct bonding.

In some embodiments, a region of the SOI substrate 11 may be weakened using ion implantation of a dopant to dictate the fracture plane for the subsequently described spalling process. The implantation of atomic or ionic species may be a single implantation, i.e., an implantation of a single atomic species, such as for example an implantation of hydrogen (H), helium (He) or another rare gas. The implantation may also be a co-implantation of atomic or ionic species, i.e., a successive implantation of at least two different species, such as co-implantation of hydrogen (H) and helium (He). The conditions of the ion implantation process may be selected to form the weakened region in the base semiconductor layer 12 of the SOI substrate 11. The formation of the weak plane through implantation can be performed on either SOI or bulk (non-SOI) silicon wafers in place of the SiGe weak fracture plane. In the embodiments including a single implantation of hydrogen (H), the implantation dose may be between $4 \times 10^{16}$ $H^+/cm^2$ and $7 \times 10^{16}$ $H^+/cm^2$ and the implantation energy may be between 20 keV and 400 keV. In the embodiments including a co-implantation of helium (He) and hydrogen (H), the helium (He) may be implanted with a dose between $0.5 \times 10^{15}$ $He^+/cm^2$ and $20 \times 10^{16}$ $He^+/cm^2$ and an implantation energy between 20 keV and 400 keV, and the hydrogen (H) may be implanted with a dose between $0.5 \times 10^{15}$ $H^+/cm^2$ and $20 \times 10^{16}$ $H^+/cm^2$ and an implantation energy between 20 keV and 400 keV. In the case of co-implantation of helium (He) and hydrogen (H), the helium (He) may be implanted into the SOI substrate 11 before the hydrogen (H).

Still referring to FIG. 7, an interface dielectric layer 15 may be formed on the SOI layer 14 of the SOI substrate 11, a strain inducing material layer 16 may be formed on the interface dielectric layer 15, and a handle substrate 17 may be formed on the strain inducing material 16. The interface dielectric layer 15 that is depicted in FIG. 7 is similar to the interface dielectric layer 6 that is described above with reference to FIG. 2. Therefore, the description of the interface dielectric layer 6 that is depicted in FIG. 2 is suitable for the interface dielectric layer 15 that is depicted in FIG. 7. The strain inducing material layer 16 depicted in FIG. 7 is similar to the strain inducing material layer 7 that is depicted in FIG. 2. Therefore, the description of the strain inducing material layer 7 that is depicted in FIG. 2 is suitable for the strain inducing material layer 16 that is depicted in FIG. 7. The handle substrate 17 that is depicted in FIG. 7 is similar to the first handle substrate 8 that is depicted in FIG. 2. Therefore, the description of that first handle substrate 8 that is depicted in FIG. 2 is suitable for the handle substrate 17 that is depicted in FIG. 7.

FIG. 7 further depicts a spalling process for separating the SOI substrate 11 within the first base semiconductor layer 12. The first base semiconductor layer 12 may be cleaved along the weakened region formed by the ion implantation of hydrogen (H) and/or helium (He). In the absence of a cleave plane in the base of the SOI wafer, the fracture depth is governed by the thickness of the strain inducing material. The presence of a cleave layer is optional for an SOI wafer as the residual Si base layer will be etched down to the BOX and will provide an atomically smooth surface required for bonding process. In one embodiment, separating the SOI substrate 11 within the first base semiconductor layer 12 includes applying a force to SOI substrate 11 through the handle substrate 17 in a direction F2 away from the SOI substrate 11.

Figure 8:
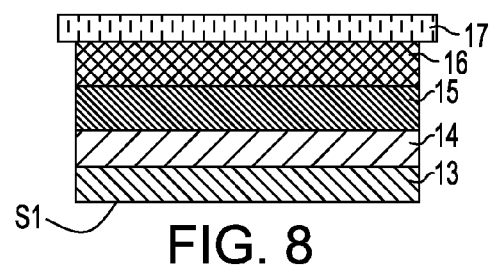
FIG. 8 is a side cross-sectional view depicting removing a remaining portion of the first base semiconductor layer that is present in contact with a buried dielectric layer of the SOI substrate to provide an exposed surface of the buried dielectric layer, in accordance with one embodiment of the present disclosure.

FIG. 8 depicts one embodiment of removing a remaining portion of the first base semiconductor layer that is present in contact with the buried dielectric layer 13 to provide an exposed surface S1 of the buried dielectric layer 13. The remaining portion of the first base semiconductor layer may be removed using a selective etch process. For example, the selective etch process for removing the remaining portion of the first base semiconductor layer may include an etch chemistry that is selective to the composition of the buried dielectric layer 13. The selective etch process may include a wet chemical etch or reactive ion etching (RIE).

Figure 9:
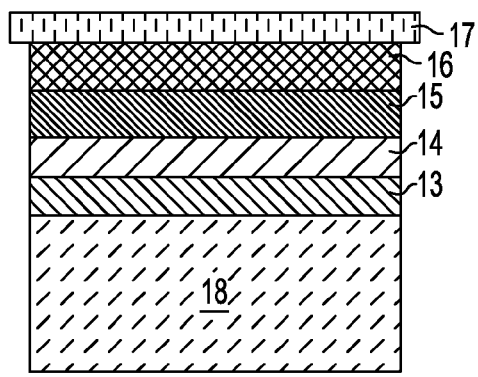
FIG. 9 is a side cross-sectional view depicting contacting a second base semiconductor layer to the exposed surface of the buried dielectric layer, wherein the second base semiconductor layer retains the strain in the semiconductor on insulator (SOI) layer, in accordance with one embodiment of the present disclosure.

FIG. 9 depicts one embodiment of contacting a second base semiconductor layer 18 to the exposed surface of the buried dielectric layer 13. The second base semiconductor layer 18 may be bonded to the exposed surface of the buried dielectric layer 13. The second base semiconductor layer 18 that is depicted in FIG. 13 is similar to the second handling substrate 10 that is described above with reference to FIG. 5. Therefore, the description of the second handling substrate 10 depicted in FIG. 5 is suitable for the second base semiconductor layer 18 that is depicted in FIG. 13. The second base semiconductor layer retains the strain produced by the strain inducing layer 16 in the semiconductor on insulator (SOI) layer upon bonding. The mechanism by which the second base semiconductor layer 18 retains the strain in the SOI layer 14 of the SOI substrate 11 depicted in FIG. 9 is similar to the mechanism by which the second handle substrate 10 retains the strain in the silicon (Si) layer 4 that is induced by the strain inducing material layer 7 that is described with reference to FIG. 5. The second base semiconductor layer 18 may be bonded to the exposed surface of the buried dielectric layer 13 using at least one of thermal bonding, compression bonding, ionic bonding, adhesive bonding and plasma activation bonding or a combination of thereof.

Figure 10:
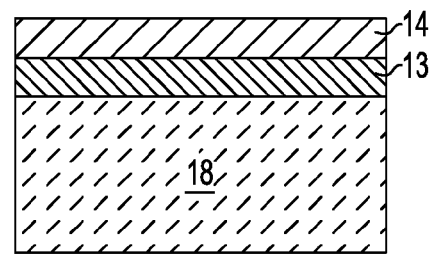
FIG. 10 is a side cross-sectional view depicting one embodiment of removing the strain inducing material layer and a handle substrate from the structure depicted in FIG. 9, in accordance with the present disclosure.

FIG. 10 depicts one embodiment of removing the interface dielectric layer 15, the strain inducing material layer 16 and the handle substrate 17 from the structure depicted in FIG. 9. In some embodiment, the interface dielectric layer 15, the strain inducing material layer 16 and the handle substrate 17 may be removed by an etch that is selective to the SOI layer 14.

Following removal of the interface dielectric layer 15, the strain inducing material layer 16 and the handle substrate 17, the remaining structure depicted in FIG. 10 provides a semiconductor substrate 100a that may include a compressively strained silicon (Si) layer having an intrinsic compressive strain ranging from 10 MPa to 2000 MPa. The compressively strained silicon (Si) layer is provided by the SOI layer 14. In one example, the intrinsic compressive strain of the compressively strained silicon (Si) layer ranges from 100 MPa to 1000 MPa. In one embodiment, the compressively strained silicon (Si) layer may have a defect density that is less than $1 \times 10^5$ defects/cm$^3$. In another embodiment, the compressively strained silicon (Si) layer may have a defect density that is less than $1 \times 10^4$ defects/cm$^3$. In yet another embodiment, the compressively strained silicon (Si) layer may have a defect density that is less than $1 \times 10^3$ defects/cm$^3$. The semiconductor substrate 100a also includes the buried dielectric layer 13 and a base semiconductor layer, i.e., second base semiconductor layer 18. The buried dielectric layer 13 is in direct contact with the SOI layer 14.

Figure 11:
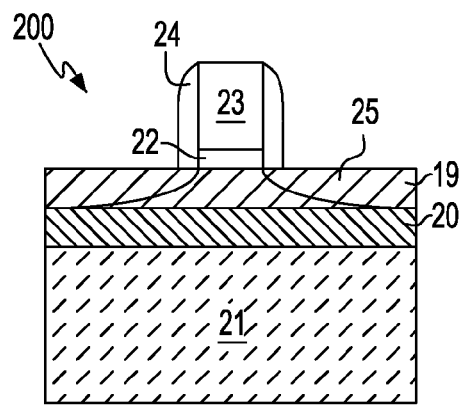
FIG. 11 a side cross-sectional view depicting a semiconductor device formed on a compressively strained silicon (Si) layer that is in direct contact with an underlying buried dielectric layer, in accordance with one embodiment of the present disclosure.

The semiconductor substrates 100, 100a provided by the methods described with reference to FIGS. 1-10 may be employed in an electrical device, as depicted in FIG. 11. In one embodiment, the electrical device may include at least one semiconductor device 200 on a device surface of a compressively strained silicon (Si) layer 19. The compressively strained silicon (Si) layer 19 may be provided by the silicon (Si) layer 4 of the method described with reference to FIGS. 1-6, or the SOI layer 14 that is described with reference to FIGS. 7-10. The compressively strained silicon (Si) layer 19 may have an intrinsic compressive strain that ranges from 10 MPa to 2000 MPa. The electrical device may further include a buried dielectric layer 20 that is in direct contact with a backside surface of the compressively strained silicon (Si) layer 19. The buried dielectric layer 20 may be provided by the dielectric layer 9 formed by the method described with reference to FIGS. 1-6, or the buried dielectric layer 13 formed by the method that is described with reference to FIGS. 7-10. The electrical device may further include a base semiconductor layer 21 positioned on a backside surface of the buried dielectric layer 20. The base semiconductor layer 21 may be provided by the second handling substrate 10 formed by the method described with reference to FIGS. 1-6, or the second base semiconductor layer 18 that is formed by the method that is described with reference to FIGS. 7-10.

In one embodiment, the at least one semiconductor device 200 is a p-type field effect transistor (FET). In one embodiment, a p-type conductivity semiconductor device, such as a pFET, is a semiconductor device 100 in which the source and drain regions 25 of the device are doped with a p-type dopant. The p-type field effect transistor (FET) that is depicted in FIG. 11 may be formed by a method that includes the steps of forming a layered stack comprising a gate dielectric 22 and a gate conductor 23 on the compressively strained silicon (Si) layer 19. The gate dielectric 22 can be formed by a thermal process, such as oxidation, or by a deposition process, such as chemical vapor deposition (CVD), plasma enhanced CVD, evaporation, atomic layer deposition (ALD) and other like deposition processes. The gate conductor 23 is formed by a deposition process, such as CVD, PECVD, sputtering, plating, evaporation, atomic layer deposition (ALD) and the like. When polySi or SiGe gates are used, the conductive material can be doped in-situ or following deposition by ion implantation. Following the formation of the layered stack, at least the gate conductor 23 (and optionally the gate dielectric 22) is patterned by lithography and etching. Thereafter, source and drain regions 25 may be ion implanted into the compressively strained silicon (Si) layer 19. The source and drain regions 25 may be implanted with p-type dopants. As used herein, "p-type" refers to the addition of impurities to an intrinsic semiconductor that creates deficiencies of valence electrons. The p-type semiconductor devices are typically produced within Si-containing substrates by doping the source and drain regions 25 with elements from group III-A of the Periodic Table of Elements. In a silicon-containing surface, such as the compressively strained silicon (Si) layer 19, examples of p-type dopants, i.e., impurities, include but are not limited to boron, aluminum, gallium and indium. Sidewalls spacers 24 may be formed by deposition and etching either before or after forming the source and drain regions 25. The source drain regions may also be formed by recessing the source/drain regions and filling up with epitaxial layers. Furthermore, the source/drain regions can be epitaxially grown to form raised source/drain structures and the extension can be formed via dopant diffusion from the raised source/drain regions. The source/drain formation may or may not involve ion implantation.

It is noted that the field effect transistors (FETs) depicted in FIG. 11 are provided for illustrative purposes only, and are not intended to limit the present, disclosure as other types of semiconductor devices are equally applicable to the methods and structures disclosed herein. For example, in addition to field effect transistors (FETs), the semiconductor devices that may be formed on the semiconductor substrates disclosed herein may include Schottky barrier devices, junction field effect transistors, fin field effect transistors (finFETs), bipolar junction transistors (BJT), flash memory devices, dynamic random access memory (DRAM) devices, embedded dynamic random access memory (EDRAM) devices or a combination thereof.

While the present disclosure has been particularly shown and described with respective to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a strained semiconductor material comprising:

providing a semiconductor on insulator (SOI) substrate that includes a semiconductor on insulator (SOI) layer that is present on a buried dielectric layer, wherein the buried dielectric layer is present on a first base semiconductor layer;

contacting the SOI layer of the SOI substrate with a strain inducing material layer, wherein the strain inducing material layer is present on a handle substrate and the strain inducing material layer induces a strain in the SOI layer of the SOI substrate;

separating the SOI substrate within the first base semiconductor layer;

removing a remaining portion of the first base semiconductor layer that is present in contact with the buried dielectric layer to provide an exposed surface of the buried dielectric layer, wherein the removing of the remaining portion of the first base semiconductor layer to provide the exposed surface of the buried dielectric layer comprises an etch that is selective to the buried dielectric layer;

contacting a second base semiconductor layer to the exposed surface of the buried dielectric layer, wherein the second base semiconductor layer retains strain in the SOI layer; and removing the strain inducing material layer and the handle substrate.

2. The method of claim 1, wherein the strain produced in the SOI layer by contacting the SOI layer of the SOI substrate with the strain inducing material layer is a compressive strain.

3. The method of claim 1, wherein the semiconductor on insulator (SOI) layer is silicon (Si), and after contacting the second base semiconductor layer to the exposed surface of the buried dielectric layer and after removing the strain inducing material layer, the semiconductor on insulator (SOI) layer has an intrinsic compressive strain.

4. The method of claim 1, wherein the strain inducing material layer is a metal selected from the group consisting of nickel (Ni), titanium (Ti), chromium (Cr), iron (Fe), tungsten (W), molybdenum (Mo) and a combination thereof, or the strain inducing material layer is a polymer that is selected from the group consisting of polyimides, polyesters, polyolefins, polyacrylates, polyurethane, polyvinyl acetate, polyvinyl chloride and a combination thereof.

5. The method of claim 1, wherein the handle substrate is an adhesive tape, and the contacting of the SOI layer of the SOI substrate comprises bonding the adhesive tape to the SOI layer of the SOI substrate.

6. The method of claim 5, wherein the adhesive tape is composed of a polymer that is selected from the group consisting of acrylics, polyesters, olefins, vinyls and a combination thereof.

7. The method of claim 1, wherein the separating the SOI substrate within the first base semiconductor layer comprises ion implanting the first base semiconductor layer to provide a cleave layer with a dopant selected from the group consisting of hydrogen (H), Helium (He), Argon (Ar), or a combination thereof, and applying a force to the SOI layer through the handle substrate in a direction away from the cleave layer.

8. The method of claim 1, wherein the contacting of the second base semiconductor layer to the exposed surface of the buried dielectric layer comprises thermal bonding.

9. The method of claim 1, wherein the removing of the handle substrate and the strain inducing material layer comprises etching with an etch chemistry that is selective to the SOI layer.

10. A method of forming a strained semiconductor material comprising:

providing a semiconductor on insulator (SOI) substrate that includes a semiconductor on insulator (SOI) layer that is present on a buried dielectric layer, wherein the buried dielectric layer is present on a first base semiconductor layer;

contacting the SOI layer of the SOI substrate with a strain inducing material layer, wherein the strain inducing material layer is present on a handle substrate and the strain inducing material layer induces a strain in the SOI layer of the SOI substrate;

separating the SOI substrate within the first base semiconductor layer;

removing a remaining portion of the first base semiconductor layer that is present in contact with the buried dielectric layer to provide an exposed surface of the buried dielectric layer;

contacting a second base semiconductor layer to the exposed surface of the buried dielectric layer, wherein the second base semiconductor layer retains strain in the SOI layer, wherein the contacting of the second base semiconductor layer to the exposed surface of the buried dielectric layer comprises thermal bonding; and removing the strain inducing material layer and the handle substrate.

11. The method of claim 10, wherein the strain produced in the SOI layer by contacting the SOI layer of the SOI substrate with the strain inducing material layer is a compressive strain.

12. The method of claim 10, wherein the semiconductor on insulator (SOI) layer is silicon (Si), and after contacting the second base semiconductor layer to the exposed surface of the buried dielectric layer and after removing the strain inducing material layer, the semiconductor on insulator (SOI) layer has an intrinsic compressive strain.

13. The method of claim 10, wherein the strain inducing material layer is a metal selected from the group consisting of nickel (Ni), titanium (Ti), chromium (Cr), iron (Fe), tungsten (W), molybdenum (Mo) and a combination thereof, or the strain inducing material layer is a polymer that is selected from the group consisting of polyimides, polyesters, polyolefins, polyacrylates, polyurethane, polyvinyl acetate, polyvinyl chloride and a combination thereof.

14. The method of claim 10, wherein the separating the SOI substrate within the first base semiconductor layer comprises ion implanting the first base semiconductor layer to provide a cleave layer with a dopant selected from the group consisting of hydrogen (H), Helium (He), Argon (Ar), or a combination thereof, and applying a force to the SOI layer through the handle substrate in a direction away from the cleave layer.

15. A method of forming a strained semiconductor material comprising:

providing a semiconductor on insulator (SOI) substrate that includes a semiconductor on insulator (SOI) layer that is present on a buried dielectric layer, wherein the buried dielectric layer is present on a first base semiconductor layer;

contacting the SOI layer of the SOI substrate with a strain inducing material layer, wherein the strain inducing material layer is present on a handle substrate and the strain inducing material layer induces a strain in the SOI layer of the SOI substrate;

separating the SOI substrate within the first base semiconductor layer;

removing a remaining portion of the first base semiconductor layer that is present in contact with the buried dielectric layer to provide an exposed surface of the buried dielectric layer;

contacting a second base semiconductor layer to the exposed surface of the buried dielectric layer, wherein the second base semiconductor layer retains strain in the SOI layer; and removing the strain inducing material layer and the handle substrate, wherein the removing of the handle substrate and the strain inducing material layer comprises etching with an etch chemistry that is selective to the SOI layer.

16. The method of claim 15, wherein the strain produced in the SOI layer by contacting the SOI layer of the SOI substrate with the strain inducing material layer is a compressive strain.

17. The method of claim 15, wherein the semiconductor on insulator (SOI) layer is silicon (Si), and after contacting the second base semiconductor layer to the exposed surface of the buried dielectric layer and after removing the strain inducing material layer, the semiconductor on insulator (SOI) layer has an intrinsic compressive strain.

18. The method of claim 15, wherein the strain inducing material layer is a metal selected from the group consisting of nickel (Ni), titanium (Ti), chromium (Cr), iron (Fe), tungsten (W), molybdenum (Mo) and a combination thereof, or the strain inducing material layer is a polymer that is selected from the group consisting of polyimides, polyesters, polyolefins, polyacrylates, polyurethane, polyvinyl acetate, polyvinyl chloride and a combination thereof.

19. The method of claim 15, wherein the separating the SOI substrate within the first base semiconductor layer comprises ion implanting the first base semiconductor layer to provide a cleave layer with a dopant selected from the group consisting of hydrogen (H), Helium (He), Argon (Ar), or a combination thereof, and applying a force to the SOI layer through the handle substrate in a direction away from the cleave layer.

* * * * *